United States Patent [19]
Ishikawa

[11] Patent Number: 5,939,792
[45] Date of Patent: Aug. 17, 1999

[54] RESIN-MOLD TYPE SEMICONDUCTOR DEVICE

[75] Inventor: Toshimitsu Ishikawa, Yokohama, Japan

[73] Assignee: Kabushiki Kaisha Toshiba, Kawasaki, Japan

[21] Appl. No.: 08/946,885

[22] Filed: Oct. 8, 1997

[30] Foreign Application Priority Data

Oct. 9, 1996 [JP] Japan ..................................... 8-285910

[51] Int. Cl.⁶ ............................. H01L 23/28; H01L 23/29
[52] U.S. Cl. ......................... 257/790; 257/787; 257/789; 257/792
[58] Field of Search ................................ 257/788, 9, 790, 257/792

[56] References Cited

U.S. PATENT DOCUMENTS 4,788,583  11/1988  Kawahara et al. ........................ 357/72
5,346,743   9/1994  Uchida et al. ............................. 428/76
5,594,204   1/1997  Taylor et al. ........................... 174/52.2

FOREIGN PATENT DOCUMENTS 2-280363  11/1990  Japan .

*Primary Examiner*—Teresa M. Arroyo
*Attorney, Agent, or Firm*—Finnegan, Henderson, Farabow, Garrett & Dunner, L.L.P.

[57] ABSTRACT

A resin-mold type semiconductor device includes a semiconductor chip, a die pad for supporting and fixing the semiconductor chip, a plurality of inner leads whose distal ends face the semiconductor chip, a plurality of outer leads integrally connected to the corresponding inner leads, bonding wires for electrically connecting distal end portions of the inner leads to terminal electrodes of the semiconductor chip, a resin-mold package for molding the die pad, the semiconductor chip, the inner leads and the bonding wires, and a highly water-absorbent insulating film made of highly water-absorbent polymer formed at least one portion of the surface of the resin-mold package.

11 Claims, 4 Drawing Sheets

RESIN-MOLD TYPE SEMICONDUCTOR DEVICE

BACKGROUND OF THE INVENTION

The present invention relates to a semiconductor device, and more particularly, to a resin-mold type semiconductor device packaged with an epoxy-based resin. The present invention is also concerned with a manufacturing method for the resin-mold type semiconductor device.

A conventionally-used resin-mold type semiconductor device is usually manufactured as follows: after a semiconductor wafer is prepared in a wafer processing step, it is diced into semiconductor chips. The semiconductor chip thus prepared is subsequently mounted on a leadframe (called "die bonding step"). Then, electrode pads formed on the semiconductor chip are connected to inner leads of the leadframe with a thin Au or Al wire (called "wire bonding step"). Finally, the semiconductor chip, the accompanying thin wires, and the inner leads are sealed with a resin (called "packaging step").

Now, the conventional resin-mold type semiconductor device will be explained with reference to FIG. 1, which is a cross-sectional view of one of the resin-mold type semiconductor devices, namely, TSOP (Thin Small Outline Package) type semiconductor device.

Semiconductor chip 1 is fixed on a die pad 6 of a leadframe 4 with a bond 7. The terminal electrodes 2 for power supply and input/output signals formed on the surface of the semiconductor chip 1 are electrically connected to inner leads 8 of the leadframe 4 by the corresponding bonding wires 3 such as a thin Au metal wire. The semiconductor chip 1, bonding wires 3, die pad 6, and inner leads 8, except for the outer leads 5, are sealed with a resin to form a resin-mold package 9. Thereafter, the outer leads 5 are cut in a desired form and bent. In this manner, finished devices are obtained.

Sealing is generally performed after the semiconductor chip is mounted on the leadframe which is formed of inner leads, outer leads, and a die pad. The surface of the semiconductor chip 1, except for electrode 2 formation portions, is protected with an insulating passivation film 10 (such as a silicon oxide film).

Examples of the sealing resins generally used are an epoxy resin mixed with a silica filler, a phenol resin, a cresol resin, a mixture of powder carbon and silicon resin particles, and the like.

The epoxy-based resin is characterized in that it has a high hygroscopicity and a high water permeability. When the epoxy series resin is used to form the resin-mold package 9, external moisture is absorbed or permeates into the package and concentrates in interfaces between heterogeneous materials, for example, between the semiconductor chip 1 and the resin-mold package 9, and between the die pad 6 and the resin-mold package 9.

Incidentally, when a surface mounting type semiconductor device is used, the resin-mold package is bonded on a wiring board with a solder by heating it to a high temperature in a so-called solder reflow processing. In the solder reflow processing, heat (240° C.) is applied to the upper surface of the wiring board or the package is placed in an atmosphere of 215° C. for several seconds. In short, the entire package is exposed to heat ranging from 215 to 240° C.

Such abrupt heating causes rapid vaporization and expansion of the moisture which has concentrated in the interface between heterogeneous materials in the semiconductor device. As a result, bulge and exfoliation occur in the resin-mold package and cracks are also generated in the interior portion. The most serious problem is the exfoliation of the resin-mold package from the die-pad.

The cracks generated in the resin-mold package allow external water and contaminants to enter, with the result that metal corrosion occurs in the terminal electrodes 2 for power supply and input/output signals formed on the surface of the semiconductor chip 1. The external contaminants include Na, K, Cl, and the like which are contained in a soldering flux and a cleaning solvent. If exfoliation takes place in the semiconductor chip 1 and cracks are generated on the upper portion of the semiconductor device, the thin metal wire 3 will be broken, causing electrical breakage.

The cracks and wire breakage will not take place in the resin-mold package if the external water does not enter and remain in the resin-mold package. To prevent external water from entering, coating of the surface of the resin-mold package with a waterproof film is known as a useful technique.

For example, Jpn. Pat. Appln. KOKAI Publication No. 2-280363 discloses a technique for coating the surface of the resin-mold package with a resin having a high moisture-resistance and heat-resistance. This is a technique for coating the surface of the resin-mold package with a silicon resin (coefficient of water absorbency: 0.05%, glass transition temperature: 300° C.) or a polyphenylene sulfide resin (coefficient of water absorbency: 0.05%, thermal deformation temperature: 300° C.), in a thickness of 5 $\mu$m or more.

Since the moisture resistance of the resin coating is high, the external water can be almost completely prevented from entering. This means conversely that internal water hardly goes out. Accordingly, the resin-mold package coated with the resin expands more than a non-coated one when extremely high heat is applied in a short time, for example, at the reflow processing. As a result, the resin-mold package with the resin coating is easily broken.

Therefore, to attain the resin-mold type semiconductor device, it is important to prevent the presence of the external and internal moisture in the resin-mold package at the time of heat processing.

BRIEF SUMMARY OF THE INVENTION

An object of the present invention is to provide a highly reliable resin-mold type semiconductor device and a method of manufacturing the same, which is capable of suppressing moisture from being absorbed and permeating in a resin-mold package and preventing exfoliation and cracks in a reflow processing.

To attain the object, the semiconductor device according to a first aspect of the present invention comprises:
 a semiconductor chip having a plurality of terminal electrodes;
 a die pad for supporting and fixing the semiconductor chip;
 a plurality of inner leads whose distal ends face the semiconductor chip;
 a plurality of outer leads integrally connected to corresponding ones of the plurality of inner leads, respectively;
 bonding wires for electrically connecting the distal ends of the plurality of inner leads to the terminal electrodes of the semiconductor chip, respectively;
 a resin-mold package for molding the die pad, the semiconductor chip, the plurality of inner leads and the plurality of bonding wires; and a highly water-absorbent insulating film made of a highly water-absorbent polymer and formed at least one portion of the surface of the resin-mold package.

It is desired that the at least one portion of the surface of the resin-mold package on which the highly water-absorbent insulating film is to be formed, is a surface portion of the resin-mold package permeable to moisture.

The at least one portion of the surface of the resin-mold package on which the highly water-absorbent insulating film is to be formed, may be a portion facing the die pad.

The at least one portion of the surface of the resin-mold package on which the highly water-absorbent insulating film is to be formed, may be a portion from which the outer leads project.

The resin-mold package may have a plurality of pits formed in at least one portion of the surface and the highly water-absorbent insulating film may be embedded in the plurality of pits.

It is desired that the plurality of pits be formed in contact with each other.

The plurality of pits may be formed at certain intervals.

It is desired that the highly water-absorbent insulating film be a sodium acrylate based polymer having a sodium carboxylate group.

According to a second aspect of the present invention, a resin-mold type semiconductor device comprising:
 a semiconductor chip having a plurality of terminal electrodes;
 a die pad for supporting and fixing the semiconductor chip;
 a plurality of inner leads whose distal ends face the semiconductor chip;
 a plurality of outer leads integrally connected to corresponding ones of the plurality of inner leads, respectively;
 bonding wires for electrically connecting the distal end portions of the plurality of inner leads to connecting the terminal electrodes of the semiconductor chip; and
 a resin-mold package for molding the die pad, the semiconductor chip, the plurality of inner leads and the plurality of bonding wires; the resin-mold package having highly water-absorbent polymer particles dispersed therein.

It is desired that the resin-mold package further contain inorganic filler particles and the highly water-absorbent polymer particles have almost equal diameters to the inorganic filler particles.

It is desirable that the highly water-absorbent polymer particles are formed of a sodium acrylate based polymer having a sodium carboxylate group.

According to a third aspect of the present invention, a method of manufacturing a resin-mold type semiconductor device comprising the steps of:
 supporting and fixing a semiconductor chip on a die pad;
 electrically connecting distal end portions of a plurality of inner leads which face the semiconductor chip to a plurality of terminal electrodes of the semiconductor chip by bonding wires, respectively;
 molding the die pad, the semiconductor chip, the plurality of inner leads and the bonding wires in a resin mold which is made of a sealing resin; and
 forming highly water-absorbent insulating film made of a highly water-absorbent polymer on a surface of the resin mold.

The step of forming a highly water-absorbent insulating film includes a step of forming the highly water-absorbent insulating film on a portion of the resin-mold package facing the die pad.

The step of forming a highly water-absorbent insulating film includes a step of forming the highly water-absorbent insulating film around an outer-lead-projecting portion of the resin-mold package.

The molding step may include a step of forming a plurality of pits on at least one portion of the surface of the resin-mold package and the highly water-absorbent insulating film formation step may include a step of embedding the highly water-absorbent insulating film in the plurality of pits.

It is desired that the molding step include a step of forming the plurality of pits in contact with each other.

The molding step may include a step of forming the plurality of pits at certain intervals.

It is desired that the water-absorbent polymer be a sodium acrylate based polymer having a sodium carboxylate group.

According to a fourth aspect of the present invention, a method of manufacturing a resin-mold type semiconductor device comprising the steps of:
 supporting and fixing a semiconductor chip on a die pad;
 electrically connecting distal end portions of a plurality of inner leads which face the semiconductor chip to a plurality of terminal electrodes of the semiconductor chip by bonding wires;
 dispersing highly water-absorbent polymer particles into a sealing resin; and
 molding the die pad, the semiconductor chip, the inner leads and the bonding wires in a resin mold which is made of the sealing resin.

It is desired that the highly water-absorbent polymer be a sodium acrylate based polymer having a sodium carboxylate group.

Feature of the present invention resides in that the highly water-absorbent polymer is provided on the surface of or inside the resin-mold package which molds a semiconductor chip.

The external moisture can be prevented to enter in the resin mold package and the internal moisture can be captured by the presence of the highly water-absorbent polymer. Therefore, it is possible to prevent occurrence of exfoliation and cracks. Examples of the highly water-absorbent polymer includes condensation polymers of a polyvinyl alcohol-, polyether-, ester-, and amide-based compounds, and synthetic polymers of maleic anhydride-, and vinylpyrrolidone-based compounds.

The highly water-absorbent polymer itself has a very high water absorption property. Actually, it absorbs water several tens to several hundreds times as large as its own weight.

When the highly water-absorbent polymer is coated over the surface of the resin mold package, the polymer holds absorbed moisture and therefore prevents moisture from permeating in the resin-mold package.

The same effects can be obtained if the highly water-absorbent polymer is embedded on the shallow surface of the resin-mold package or if particles of the highly water-absorbent polymer are dispersed and mixed in the resin-mold package. Particularly, the latter method is advantageous because it can be adopted to the presently-employed steps without changing them and can produce desired effects, since the polymer particles are dispersed and mixed in the sealing resin in advance.

Hereinbelow, the highly water-absorbent polymer will be explained.

The highly water-absorbent polymer is defined as a polymer capable of absorbing and holding water several tens to several hundreds times as large as its own weight without dissolving in water. For example, a highly water-absorbent polymer of a polyvinyl alcohol based compound is a non-ionic polymer having a hydroxyl (—OH) group serving as a hydrophilic functional group.

As a water-absorbable material, cotton, pulp and sponge are known. Such a water-absorbable material absorbs and holds water in spaces formed within the material by use of capillary action. The absorbency of the material is low and its water holding ability is also poor. As a result, water readily comes out therefrom when a small pressure is applied.

In contrast, the highly water absorbent polymer incorporates water into spaces within a molecular chain constituting the polymer. Since the spaces of the polymer are very small in size compared to those of the water absorbable material, the polymer can absorb water several hundreds as large as its weight. In addition, the polymer has excellent water holding property. Therefore, once it absorbs water and changes into a swelled hydrogel, it never release water even if pressure is applied thereon.

There are a wide variety of forms in the highly water-absorbent polymers including film-form (used as a coating agent), powder form, particulate form, flake form, fiber-form, nonwoven fabric form, lumpy form, foamy form, and the like.

The highly water-absorbent polymer is one essentially containing an ionic group. The ionic group is a salt-form group formed of a positive ion and a negative ion combined with each other. The highly water-absorbent polymer has a bridged structure in polymer molecules connect each other. For example, a well-known polymer having a high water absorption property has a bridged structure of a sodium acrylate based polymer having a sodium carboxylate group (—COO—Na$^+$) as the ionic group.

The bridged structure is defined as a construct consisting of a long polymer chain which is tangled and linked in some portions to form a tertiary network structure. Such a tertiary network structure is packed densely in the highly water-absorbent polymer. Each polymer chain contains a sodium carboxylate group which is readily decomposed into positive ions and negative ions in water because of its hydrophilic and electrolytic properties. As a result, when the polymer absorbs water, it is readily dissolved in water and expand. As water permeates into the mesh formed of polymer molecular chains, sodium ions dissociate from the sodium carboxylate group. As a result, only carbonyl groups are left in the polymer chain.

The carbonyl groups (negative ions) left in the polymer chain are electrically repel each other. Meshes of the polymer chains are enlarged by the repulsion force. As a result, a large amount of water is incorporated within the meshes and held therein. By virtue of the tertiary network structure, high water absorbency can be imparted to the polymer.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings:

(Embodiment 1)

Figure 1:
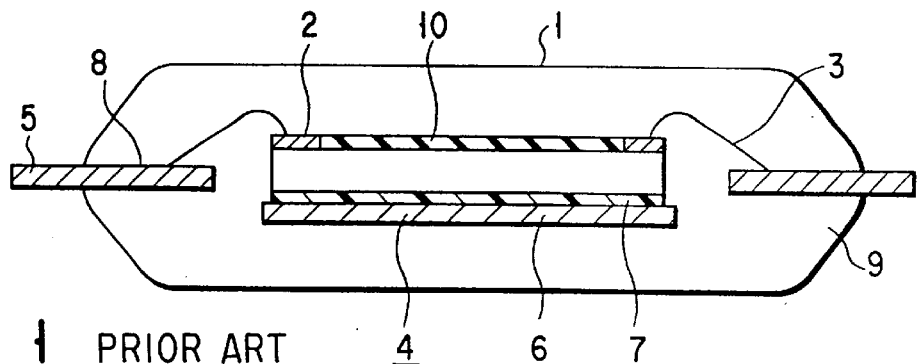
FIG. 1 is a cross-sectional view of a conventional TSOP type semiconductor device.
Figure 2:
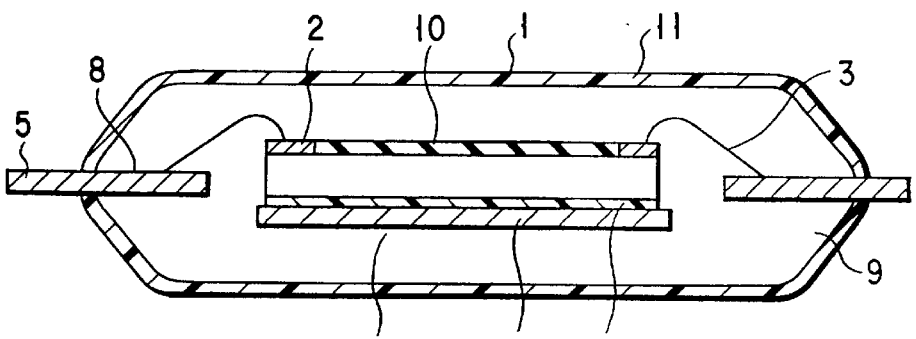
FIG. 2 is a cross-sectional view of a TSOP type semiconductor device according to Embodiment 1 of the present invention.

FIG. 2 is a cross-sectional view of a TSOP type semiconductor device having a resin-mold package coated with a highly water-absorbent polymer over the surface thereof.

A semiconductor chip 1 is fixed on a die pad 6 of a leadframe 4 with a bond 7. Terminals for power supply and a signal electrode (connecting electrode) 2 formed on the surface of the semiconductor chip 1 are electrically connected to inner leads 8 of the leadframe 4 with the corresponding bonding wires 3 such as a thin metal Au wire.

The surface of the semiconductor chip 1 except for an electrode 2 formation region, is protected by an insulating passivation film 10 (such as a silicon oxide film). The semiconductor chip 1, bonding wires 3, die pad 6, and inner leads 8 are sealed with a resin to form a resin-mold package 9.

Thereafter, the outer leads 5 are cut in a desired form and bent. In this manner, finished devices are prepared. In short, the resin-mold package is first formed after the semiconductor chip is mounted on the leadframe formed of the inner leads, the outer leads, and the die pad. Then, formation of the outer leads is made.

As the sealing resin, an epoxy resin containing a silica filler in an amount of 70 to 80% by weight based on the overall weight of the resin-mold package, is used. A phenol resin, a cresol resin, a mixture of powder carbon and silicon resin particles, or the like may be used as the sealing resin. The surface of the resin-mold package 9 is coated with a highly water-absorbent insulating film 11 formed of a highly water-absorbent polymer.

The highly water-absorbent film 11 is coated by an ion-plating method. Since the entire surface of the resin-mold package 9 is inevitably coated by the ion-plating method, it is necessary to apply masking to the outer lead portions 5 projecting from the resin-mold package 9. After coating, the masking is removed. There are various methods for coating the highly water-absorbent polymer. For example, a masking provided semiconductor device may be soaked in a molten polymer. Alternatively, the polymer may be spread or sprayed on the resin-mold package to form the polymer film.

The resin-mold package formed of the epoxy-based resin is characterized in that it has high water absorbency and high water permeability. However, since the highly water-absorbent polymer is present, external water can be prevented from entering and permeating into the resin-mold package. At the same time, internal water can be captured by the polymer. As a result, no exfoliation and cracks are observed in the resin-mold package even if the resin-mold package is subjected to a reflow processing. In addition, dry treatment can be omitted which is usually performed prior to the shipment of finished devices.

Highly water-absorbent polymer used in the insulation film 11 is capable of absorbing water in an amount of 10 g per unit polymer (1 g). In contrast, about 1000 ppm (0.001 g) of water is only attached per unit weight (1 g) of the semiconductor chip. From this, it is clear that the highly water-absorbent polymer sufficiently plays a role in protecting the resin-mold package.

Figure 3:
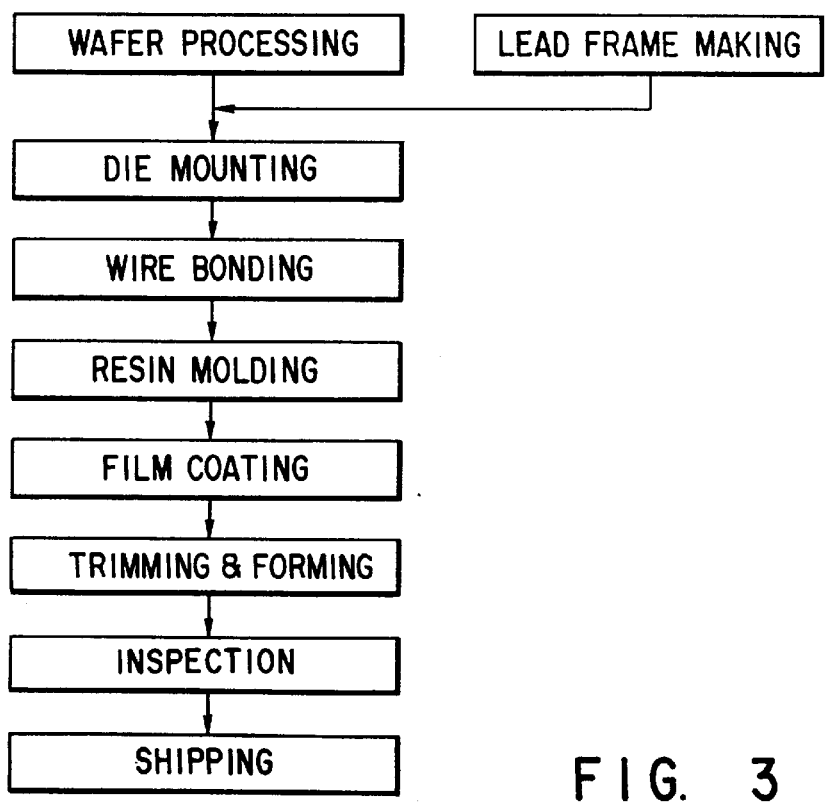
FIG. 3 is a flow chart of manufacturing steps of the semiconductor device according to Embodiment 1.
Figure 4:
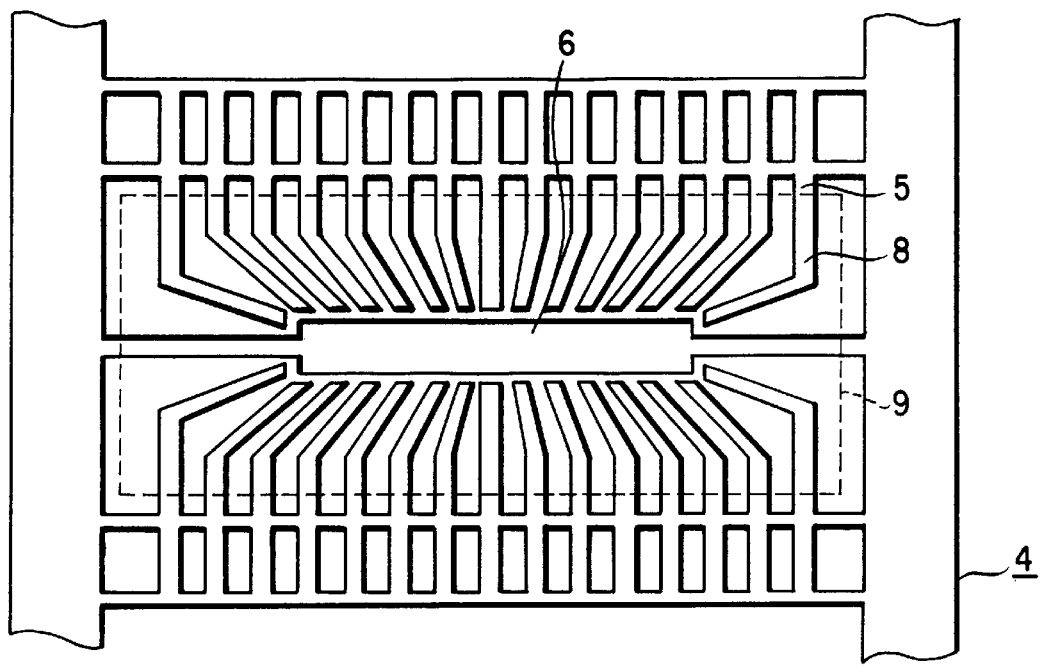
FIG. 4 is a plan view of a leadframe used in the semiconductor device of Embodiment 1.

Next, steps of manufacturing the resin-mold type semiconductor device of Embodiment 1 will be explained with reference to FIGS. 3 and 4. FIG. 3 is a flowchart showing the manufacturing steps. FIG. 4 is a plan view of a leadframe on which a semiconductor chip is mounted.

As shown in FIG. 3, a wafer such as a silicon semiconductor is subjected to probing and dicing processing successively to form a semiconductor chip (wafer processing step).

In parallel to the wafer processing step, a leadframe is formed by subjecting a metal material (such as Cu, a Cu alloy, Fe—42Ni) to a photo patterning, etching, and plating, sequentially (leadframe preparation step).

As shown in FIG. 4, the leadframe 4 has a die pad 6 positioned at the center of the leadframe, outer leads 5, and inner leads 8. The die pad 6 is suspended by pins connected to the leadframe. Each of the outer leads 5 has one end connected to the frame and the other end continuously connected to inner leads. Each of the inner leads 8 has one end continuously connected to the outer lead and the other end facing the die pad 6.

As a next step, the semiconductor chip 1 is fixed on the die pad 6 of the leadframe 4 with a bond 7 (chip mounting step).

Then, the terminal electrodes for power supply and input/output signals formed on the semiconductor chip 1 are electrically connected to the inner leads 8 by using a wire bonder (wire bonding step).

The leadframe 4 having the semiconductor chip mounted thereon is placed in a cavity of a mold for a resin package. The semiconductor chip 1, bonding wires 3, die pad 6, bond 7, and inner leads 8 are placed in the cavity of the mold for resin package.

The cavity is filled with a molding resin (sealing resin) by, for example, a transfer mold method to form the resin-mold package 9 sealing the semiconductor chip, die pad, bond, and inner leads. Note that the outer leads 8 project from the resin-mold package 9 (resin sealing step).

Next, the highly water-absorbent polymer is coated over the surface of the resin-mold package 9 to form a highly water-absorbent insulating film 11. To avoid coating over the outer leads 5, masking is provided on the outer leads 5 (highly water-absorbent insulating film formation step).

The outer leads 5 are trimmed (cut off) from the leadframe in a desired form and bent. In this manner, finished devices are obtained (outer lead trimming and forming step).

After the finished devices are inspected, the devices are shipped (Shipping step).

In the steps mentioned above, a resin-mold type semiconductor device shown in FIG. 2 can be manufactured.

(Embodiment 2)

In Embodiment 2, the highly water-absorbent insulating film is embedded in a surface layer of the resin-mold package.

Figure 5A:
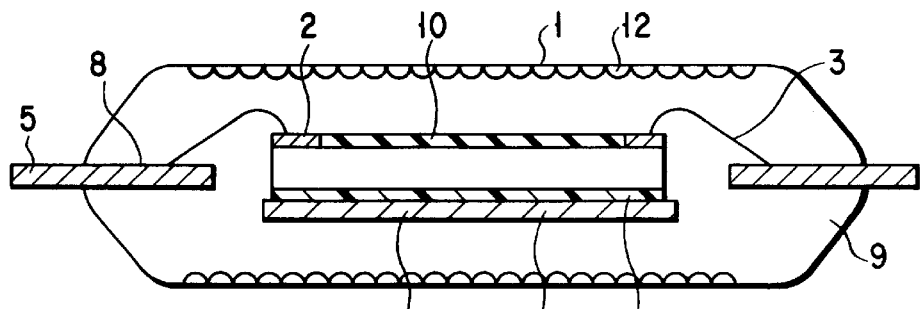
FIG. 5A is a cross-sectional view of a TSOP type semiconductor device according to Embodiment 2 of the present invention.
Figure 5B:
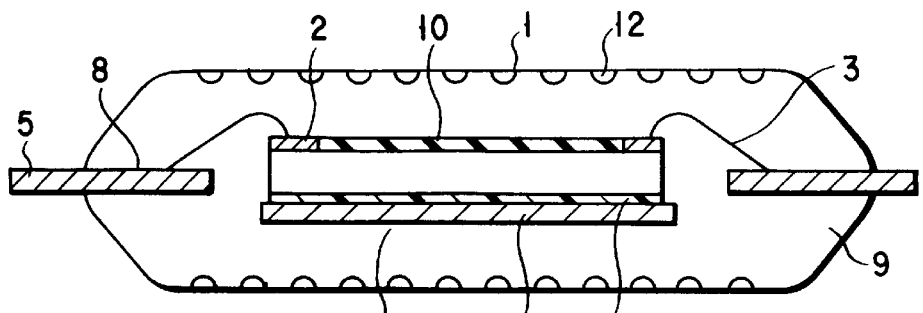
FIG. 5B is a cross-sectional view of the TSOP type semiconductor device modified from Embodiment 2 of the present invention.
Figure 6A:
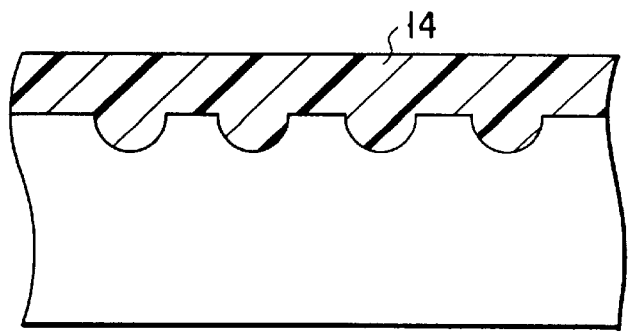
FIGS. 6A and 6B are partial sectional views of the semiconductor device of Embodiment 2, showing the manufacturing steps of the semiconductor device, in order.
Figure 6B:
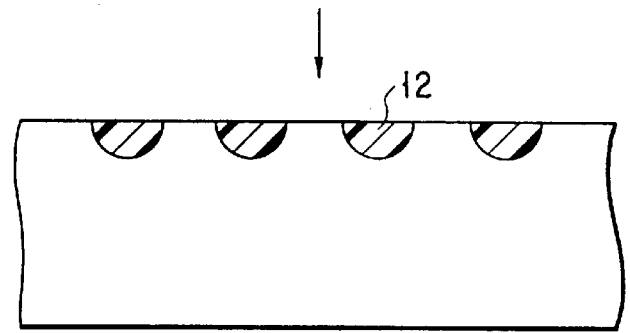

FIGS. 5A and 5B show cross sectional views of TSOP type semiconductor devices. FIGS. 6A and 6B are partial sectional views of the semiconductor device showing how to form the highly water-absorbent insulating film.

A semiconductor chip 1 is fixed on a die pad 6 of a leadframe 4 with a bond 7. Terminal electrodes 2 for power supply and input/output signals formed on the surface of the semiconductor chip 1 are electrically connected to inner leads 8 of the leadframe 4 by the corresponding bonding wires 3 such as a thin Au metal wire.

The surface of the semiconductor chip 1 except for electrode 2 formation regions is protected by an insulating passivation film 10 (such as a silicon oxide film). The semiconductor chip 1, bonding wires 3, die pad 6, inner leads 8, except for the outer leads 5, of the leadframe 4 are sealed with a resin in a resin-mold package 9. The outer leads are cut in a desired form and bent. In this manner, the finished devices are obtained.

As the sealing resin, an epoxy resin containing a silica filler in an amount of 70 to 80% by weight based on the overall weight of the resin-mold package is used. A highly water-absorbent insulation film 12 made of a highly water-absorbent polymer of a polyacrylate-based polymer is embedded in depressed portions (pits) which are formed in the surface of the resin-mold package 9. The depressed portions (50 to 100 μm in diameter) are formed in contact with each other as shown in FIG. 5A or at certain intervals as shown in (FIG. 5B).

To embed the highly water-absorbent film in the resin-mold package 9, first the highly water-absorbent polymer layer 14 is coated on a predetermined region rather thicker by the ion plating method (FIG. 6A). Since the entire surface of the resin-mold package 9 is inevitably coated by the ion plating method, the outer lead portions 5 projecting from the resin-mold package 9 must be masked. After coating, the mask is removed.

Next, the surface of the highly water-absorbent polymer layer 14 is polished to remove the polymer from the surface except for the depressed portions. In this way, the highly water-absorbent insulating film 12 is left in the depressed portions (FIG. 6B).

The resin-mold package formed of an epoxy-based resin has a high hygroscopicity and water permeability. However, due to the presence of the high water-absorbency polymer, external water can be suppressed from entering and permeating into the resin-mold package. At the same time, internal water can be captured by the polymer. As a result, no exfoliation and cracks are observed in the resin-mold package even if the resin-mold package is subjected to a reflow processing. In addition, dry treatment can be omitted which is usually performed prior to the shipment of finished devices. The manufacturing steps of this embodiment are the same as in Embodiment 1 (FIG. 3).

(Embodiment 3)

Figure 7:
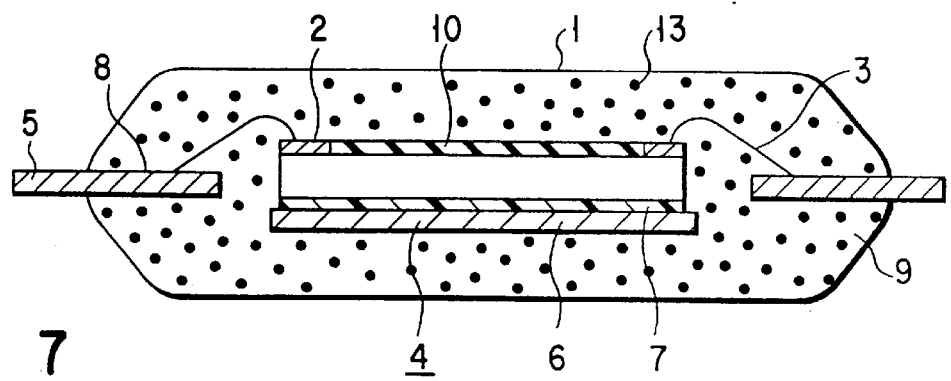
FIG. 7 is a cross-sectional view of a TSOP type semiconductor device according to Embodiment 3 of the present invention.

In Embodiment 3, a highly water-absorbent insulating film is not formed on the surface of the resin-mold package. FIG. 7 is a cross-sectional view of a TSOP type semiconductor device.

A semiconductor chip 1 is fixed on a die pad 6 of a leadframe 4 with a bond 7. Terminal electrodes 2 for power supply and input/output signals formed on the surface of the semiconductor chip 1 are electrically connected to inner leads 8 of the leadframe 4 by the corresponding bonding wires 3 such as a thin Au metal wire.

The surface of the semiconductor chip 1 except for an electrode 2 formation region, is protected by an insulating passivation film 10 (such as a silicon oxide film). The semiconductor chip 1, bonding wires 3, die pad 6, inner leads 8 are sealed with a resin to form a resin-mold package 9. The outer leads are cut in a desired form and bent. In this manner, finished devices are obtained.

As the sealing resin, an epoxy resin containing a silica filler in an amount of 70 to 80% by weight based on the overall weight of the resin-mold package, is used. In the resin-mold package 9, particles of a polyacrylate-based polymer 13 having high water-absorbency are dispersed. The diameters of the polyacrylate-based polymer 13 fall within the range of 10 to 100 $\mu$m, which are almost equal to that of the silica filler.

The manufacturing steps of the semiconductor device of this embodiment are as follows. Highly water-absorbent polymer particles 13 are previously mixed in a mold resin and dispersed uniformly, and then injected into a mold to seal. That is, a highly water-absorbent insulating film formation step is omitted from the flow chart shown in FIG. 3. In other words, manufacturing proceeds: wire bonding step→resin-sealed packaging step→outer lead trimming and forming step.

As described, the manufacturing steps are simplified in this embodiment. Since the particles of the highly water-absorbent polymer have almost equal diameters to the silica filler particles mixed in the resin-mold package 9, the silica filler particles can be mixed and dispersed uniformly into the sealing resin.

However, due to the presence of the high water-absorbency polymer, external water can be suppressed from entering and permeating into the resin-mold package. At the same time, internal water can be captured by the polymer. As a result, the occurrence of exfoliation and cracks in the resin-mold package can be reduced to a minimum level even if the resin-mold package is subjected to a reflow processing. In addition, dry treatment can be omitted which is usually performed prior to the shipment of finished devices.

(Embodiment 4)

Figure 8:
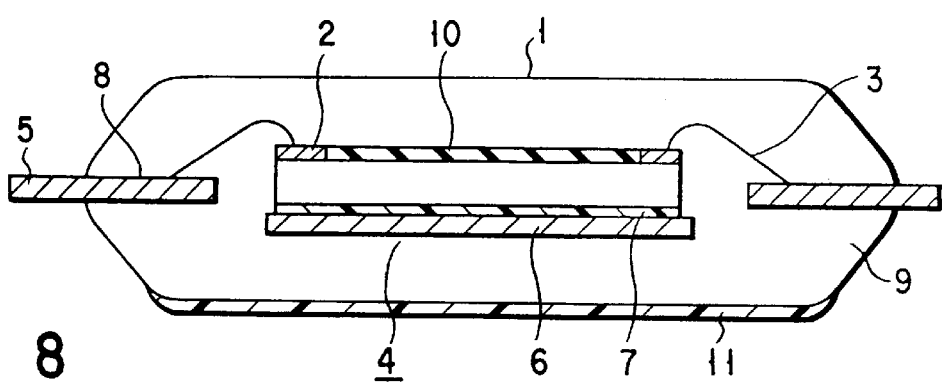
FIG. 8 is a cross-sectional view of a TSOP type semiconductor device according to Embodiment 4 of the present invention.
Figure 9:
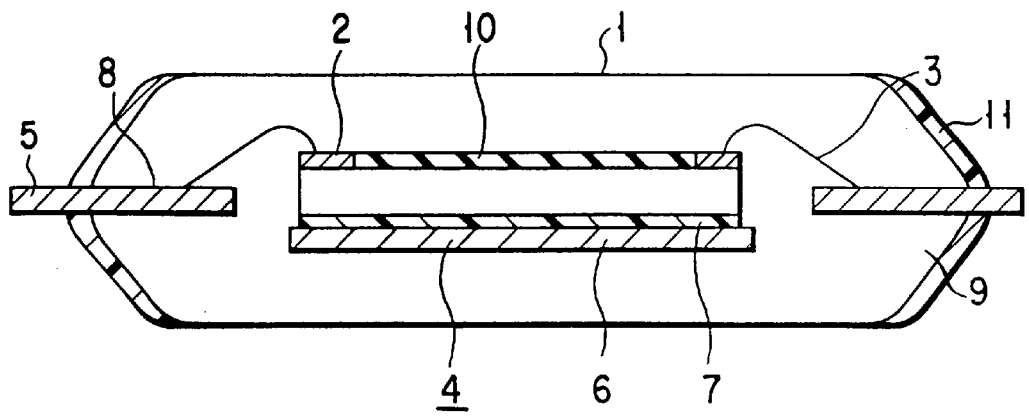
FIG. 9 is a cross-sectional view of a TSOP type semiconductor device modified from Embodiment 4 of the present invention.

FIGS. 8 and 9 are a cross-sectional view of a TSOP type semiconductor device having a highly water-absorbent polymer coating on the surface of the resin-mold package. The highly water-absorbent polymer is not necessary to coat over the entire resin-mold package. In this embodiment, to reduce the water content in the resin-mold package, the polymer is coated only on an interior portion in which water tends to concentrate and on a surface portion permeable to water.

To be more specific, since water tends to remain in the interface between the die pad 6 and the resin-mold package 9, the highly water-absorbent insulating film 11 is formed over the surface of the resin-mold package 9 facing the die pad 6.

In FIG. 8, the highly water-absorbent insulating film is formed over the rear surface of the resin-mold package. The insulating film may be formed over the upper surface or both surfaces. Since water tends to enter from the interface between the resin-mold package 9 and the outer leads 5, the insulating film 11 may be formed only around the outer lead 5, as shown in FIG. 9.

A semiconductor chip 1 is fixed on a die pad 6 of a leadframe 4 with a bond 7. The terminal electrodes 2 for power supply and input/output signals formed on the surface of the semiconductor chip 1 are electrically connected to inner leads 8 of the leadframe 4 with the corresponding bonding wires 3 such as a thin Au metal wire.

The surface of the semiconductor chip 1 except for electrode 2 formation regions, is protected by an insulating passivation film 10 (such as a silicon oxide film). The semiconductor chip 1, bonding wires 3, die pad 6, inner leads 8, except for the outer leads 5, are sealed with a resin to form a resin-mold package 9, is used Thereafter, the outer leads 5 of the leadframe 4 are cut in a desired form and bent. In this manner, finished devices are obtained. As the sealing resin, an epoxy resin containing a silica filler in an amount of 70 to 80% by weight based on the overall weight of the resin-mold package. The highly water-absorbent insulating film 11 is coated, for example, by the ion plating method.

Since the entire surface of the resin-mold package 9 is inevitably coated by the ion plating method, the outer lead portions 5 projecting from the resin-mold package 9 must be masked. After coating, the mask is removed.

Due to the presence of the high water-absorbency polymer, external water can be suppressed from entering and permeating into the resin-mold package. At the same time, internal water can be captured by the polymer. As a result, no exfoliation and cracks are observed in the resin-mold package even if the resin-mold package is subjected to a reflow processing. In addition, dry treatment can be omitted which is usually performed prior to the shipment of finished devices.

This is because the content of water permeating into the sealing resin is only several hundreds ppm (500–800 ppm in the case of TSOP). The highly water-absorbent polymer acts as a barrier to water.

Figure 10A:
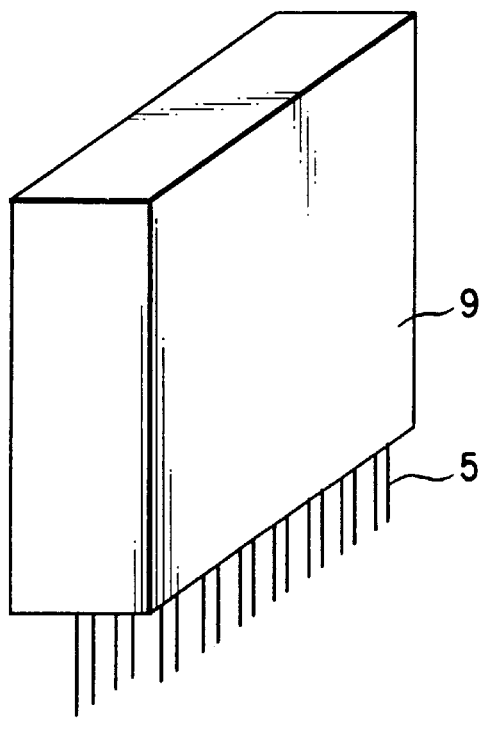
FIGS. 10A and 10B are perspective views of packages of a semiconductor device to which the present invention can be applied.
Figure 10B:
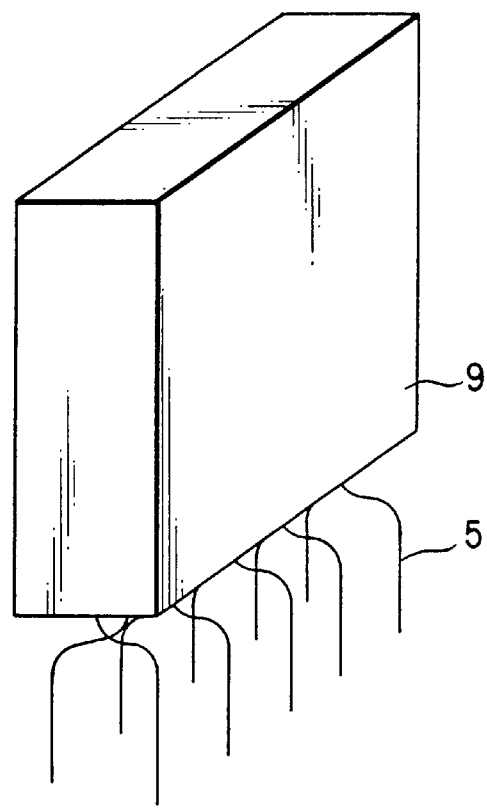

In the foregoing, the TSOP type semiconductor device has been explained as the resin-mold type semiconductor device. The present invention is not limited to the TSOP type and may be applied to an SIP (Single Inline Package) semiconductor device (FIG. 10A) and a ZIP (Zigzag inline package) type semiconductor device (FIG. 10B).

The present invention is advantageous in that virtually no water permeates into the resin-mold package since the highly water-absorbent polymer is coated over the surface of the resin-mold package or dispersed in the resin-mold package. If water permeates, it hardly reach the interface between the resin-mold package and the die pad. Hence, the occurrence of the exfoliation and cracks, which are usually produced by the reflow processing, can be significantly reduced in the present invention.

If the present invention is adopted to manufacture the resin-mold type semiconductor device, highly reliable resin-mold type semiconductor device can be obtained at low cost. Until now, finished devices are shipped after dry treatment is carried out to eliminate moisture present inside the device. However, the dry treatment is not required in the present invention. Furthermore, moisture-proof shipping package is not needed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A resin-mold type semiconductor device comprising:
   a semiconductor chip having a plurality of terminal electrodes;
   a die pad for supporting and fixing said semiconductor chip;
   a plurality of inner leads whose distal ends face said semiconductor chip;
   a plurality of outer leads integrally connected to corresponding ones of said plurality of inner leads, respectively;
   bonding wires for electrically connecting said distal ends of said plurality of inner leads to said terminal electrodes of said semiconductor chip, respectively;
   a resin-mold package including epoxy resin for molding said die pad, said semiconductor chip, said plurality of inner leads and said plurality of bonding wires; and
   a highly water-absorbent insulating film made of a highly water-absorbent polymer having a higher water absorbance than that of said epoxy resin, being able to absorb water by 100 times or more weight thereof and formed at least on a portion of a surface of said resin-mold package.

2. The resin-mold type semiconductor device according to claim 1, wherein said at least one portion of said surface of said resin-mold package on which said highly water-absorbent insulating film is to be formed, is a surface portion of said resin-mold package permeable to moisture.

3. The resin-mold type semiconductor device according to claim 1, wherein said at least one portion of said surface of said resin-mold package on which said highly water-absorbent insulating film is to be formed, is a portion facing said die pad.

4. The resin-mold type semiconductor device according to claim 1, wherein said at least one portion of said surface of said resin-mold package on which said highly water-absorbent insulating film is to be formed, is a portion from which said outer leads project.

5. A resin-mold type semiconductor device comprising:
   a semiconductor chip having a plurality of terminal electrodes;
   a die pad for supporting and fixing said semiconductor chip;
   a plurality of inner leads whose distal ends face said semiconductor chip;
   a plurality of outer leads integrally connected to corresponding ones of said plurality of inner leads, respectively;
   bonding wires for electrically connecting said distal ends of said plurality of inner leads to said terminal electrodes of said semiconductor chip, respectively;
   a resin-mold package for molding said die pad, said semiconductor chip, said plurality of inner leads and said plurality of bonding wires; and
   a highly water-absorbent insulating film made of a highly water-absorbent polymer and formed at least on a portion of a surface of said resin-mold package,
   wherein said resin-mold package has a plurality of pits formed in at least one portion of said surface, and said highly water-absorbent insulation film is embedded in said plurality of pits.

6. The resin-mold type semiconductor device according to claim 5, wherein said plurality of pits are formed in contact with each other.

7. The resin-mold type semiconductor device according to claim 5, wherein said plurality of pits are formed at certain intervals.

8. The resin-mold type semiconductor device according to claim 1, wherein said highly water-absorbent insulating film is a sodium acrylate based polymer having a sodium carboxylate group.

9. A resin-mold type semiconductor device comprising:
   a semiconductor chip having a plurality of terminal electrodes;
   a die pad for supporting and fixing said semiconductor chip;
   a plurality of inner leads whose distal ends face said semiconductor chip;
   a plurality of outer leads integrally connected to corresponding ones of said plurality of inner leads, respectively;
   bonding wires for electrically connecting said distal end portions of said plurality of inner leads to said terminal electrodes of said semiconductor chip; and
   a resin-mold package including epoxy resin for molding said die pad, said semiconductor chip, said plurality of inner leads and said plurality of bonding wires, said resin-mold package having highly water-absorbent polymer particles, which have a higher water absorbance than that of said epoxy resin and are able to absorb water by 100 times or more weight of said particles, dispersed therein.

10. The resin-mold type semiconductor device according to claim 9, wherein said resin-mold package further contains inorganic filler particles, and said highly water-absorbent polymer particles have almost equal diameters to said inorganic filler particles.

11. The resin-mold type semiconductor device according to claim 9, wherein said highly water-absorbent polymer particles are formed of a sodium acrylate based polymer having a sodium carboxylate group.

* * * * *